(12) United States Patent
Buhler et al.

(10) Patent No.: US 6,775,344 B1
(45) Date of Patent: Aug. 10, 2004

(54) DROPOUT RESISTANT PHASE-LOCKED LOOP

(75) Inventors: Otto Buhler, Boulder, CO (US); Jeffrey M. Waynik, Nederland, CO (US); Forest K. Dillinger, Golden, CO (US)

(73) Assignee: Storage Technology Corporation, Louisville, CO (US)

( * ) Notice: Subject to any disclaimer, the term of this patent is extended or adjusted under 35 U.S.C. 154(b) by 0 days.

(21) Appl. No.: 09/285,941

(22) Filed: Apr. 2, 1999

(51) Int. Cl.[7] ............................. H03D 3/24; H03D 1/00; H04L 27/06
(52) U.S. Cl. ........................................ 375/376; 375/340
(58) Field of Search ................................. 375/373, 374, 375/376, 327; 327/142, 146, 147, 148, 155, 156, 157; 331/1 A, 1 R, 17, 18, 25; 713/400, 500

(56) References Cited

U.S. PATENT DOCUMENTS

| | | |
|---|---|---|
| 3,865,981 A | 2/1975 | Welch et al. |
| 4,017,895 A | 4/1977 | Oprandi et al. |
| 4,394,778 A | 7/1983 | Ikeguchi et al. |
| 4,433,424 A | 2/1984 | Taber et al. |
| 4,568,888 A | 2/1986 | Kimura et al. |
| 4,680,778 A | 7/1987 | Krinock |
| 4,903,329 A | 2/1990 | Marik et al. |
| 4,953,185 A * | 8/1990 | Goode .......................... 375/354 |
| 5,410,557 A | 4/1995 | Scholz |
| 5,463,351 A * | 10/1995 | Marko et al. ................ 375/376 |
| 5,574,407 A * | 11/1996 | Sauer et al. ................... 331/17 |
| 5,619,161 A | 4/1997 | Novof et al. |
| 5,754,353 A | 5/1998 | Behrens et al. |
| 5,847,614 A | 12/1998 | Gilbert et al. |
| 5,994,932 A | 11/1999 | Ando |

FOREIGN PATENT DOCUMENTS

| | | |
|---|---|---|
| EP | 0 211 674 | 2/1987 |
| EP | 0 585 090 | 3/1994 |
| EP | 0 597 372 | 5/1994 |
| EP | 0 763 825 | 3/1997 |
| JP | 10 031869 | 2/1998 |
| JP | 10 215175 | 8/1998 |

* cited by examiner

*Primary Examiner*—Betsy L. Deppe
(74) *Attorney, Agent, or Firm*—Brooks Kushman P.C.

(57) ABSTRACT

Data signal dropout may cause loss of synchronization between the data signal and a data clock. A dropout resistant system for generating the data clock synchronized to the data signal includes a phase-locked loop. The phase-locked loop outputs the data clock having frequency and phase based on phase difference between the data signal and the data clock. The phase-locked loop holds constant the data clock frequency and minimizes phase shift during periods when an indication of the data signal quality drops beneath a threshold level.

13 Claims, 10 Drawing Sheets

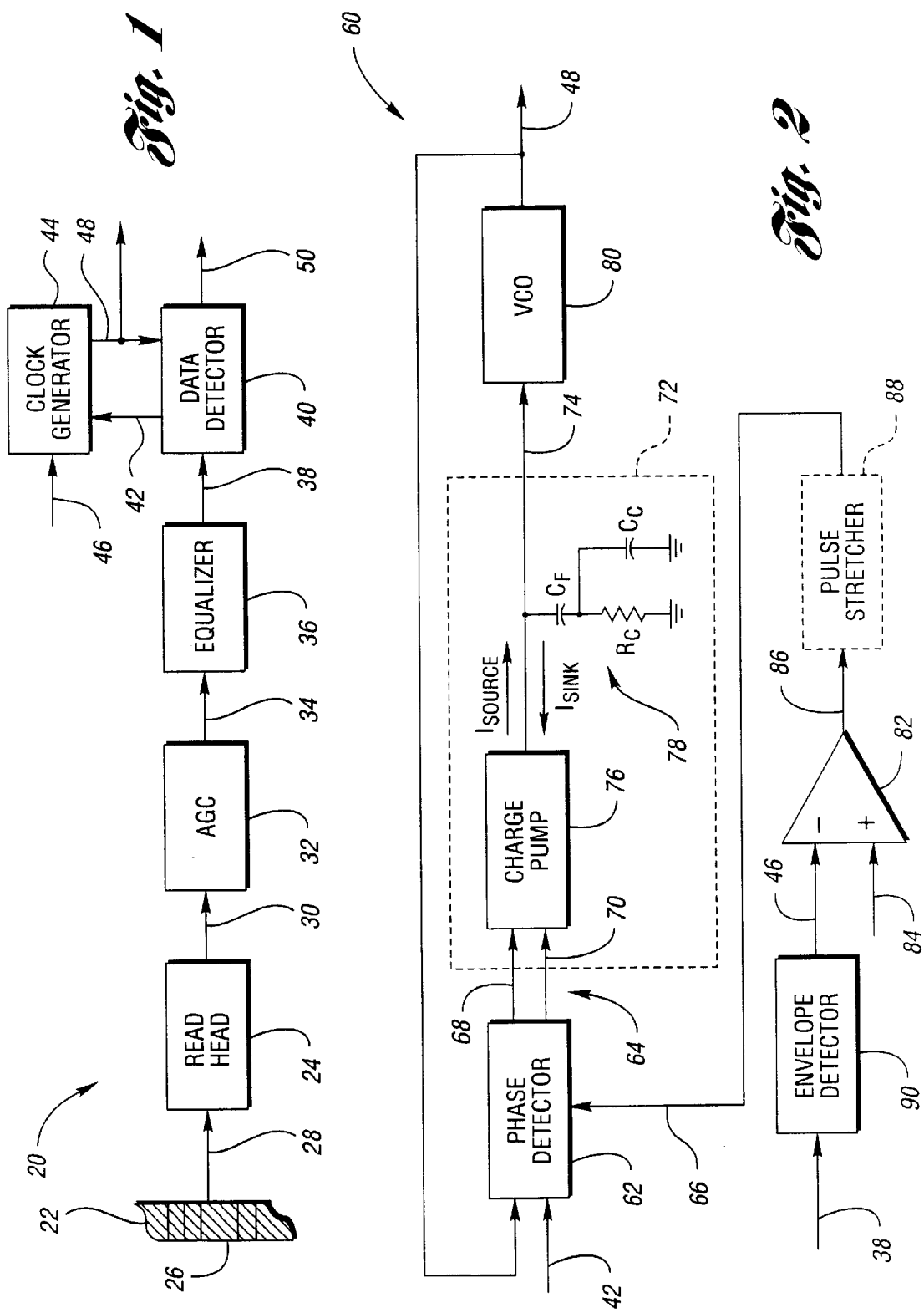

DROPOUT RESISTANT PHASE-LOCKED LOOP

TECHNICAL FIELD

The present invention relates to generating a data clock synchronized to a received data signal in the presence of data signal dropout.

BACKGROUND ART

Digital information may be represented by analog pulses in a data signal. Recovery of the digital information requires sampling the data signal at a particular instant during the time period for each analog pulse. A data clock is used to determine the sampling time. For correct sampling, the data clock needs to be synchronized with the received data signal.

A phased-locked loop (PLL) is often used to synchronize the data clock to the received data signal. These PLLs generally include a phase detector for determining the phase difference between pulses in the data signal and corresponding edges in the data clock. The phase difference produced by the phase detector is processed by a loop error controller. The loop error controller includes a filter/compensator for determining the dynamic response of the PLL. A voltage controlled oscillator (VCO) outputs the data clock based on the filtered phase difference signal. There are many designs for PLLs. In one design, a charge pump uses the phase difference signal to drive a single-ended analog filter/compensator circuit. In another design, the loop error controller includes a differential charge pump which uses the phase difference signal to drive an analog differential filter/compensator with a charge source and a charge sink. Correction circuitry uses a common mode output of the differential/compensator to drive a low voltage correcting charge pump and a high voltage correcting charge pump to keep voltage levels within preset limits.

The presence of dropout in the received data signal affects the ability to recover digital information. Dropout is the decrease in the signal amplitude of the received data signal. When the data signal results from reading magnetic tape, dropout may be caused by defects in the magnetic tape. These defects may weaken magnetic field transitions on the tape. Defects may also increase the distance between the magnetic tape and read and write heads. In addition to a decrease in the read signal amplitude envelope, a reduction in high frequency components due to dropout changes the shape of pulses in the read signal making correct detection of data more difficult. In particular, the phase detector may not be able to determine the phase difference between the data clock and weakened pulses in the data signal. This permits a phase error to accumulate which drives the PLL out of lock resulting in the loss of data bits until synchronization is again obtained. The loss of data bits expends error correction capability and may require a portion of the tape to be replayed.

Previous solutions to compensating for dropout in a PLL have concentrated on minimizing frequency drift in analog synchronous receivers. In these systems, the PLL is used to generate a local carrier frequency for synchronous demodulation. Minimizing frequency drift is not sufficient in digital detection because it permits phase shift resulting in duplicated or missed sampling.

What is needed is a dropout resistant data clock synchronized to the received data signal. The data clock should include a PLL that holds the data clock frequency constant and minimizes phase shift during periods of decreased data signal quality occurring during dropout. Such a system should be economical to produce and be easily integrated into existing magnetic tape read/write systems.

DISCLOSURE OF INVENTION

It is an object of the present invention to provide for generating a dropout resistant data clock synchronized to a received data signal.

Another object of the present invention is to provide a dropout resistant PLL that holds the data clock frequency constant and minimizes phase shift during periods of decreased data signal quality.

Still another object of the present invention is to provide for reading magnetic tape in the presence of dropout.

Yet another object of the present invention is to provide for economical dropout compensation.

In carrying out the above objects and other objects and features of the present invention, a dropout resistant system for generating a data clock synchronized to a received data signal is provided. The system includes a phase-locked loop for outputting the data clock with frequency and phase based on phase difference between the data signal and the data clock. The phase-locked loop holds constant the data clock frequency during periods when at least one indication of data signal quality falls outside of at least one threshold level.

In an embodiment of the present invention, the PLL resumes outputting data clock frequency and phase based on phase difference between the data signal and the data clock after a preset delay time from when the data signal quality indication returns within the at least one threshold level.

In another embodiment of the present invention, the data signal quality indication is based on at least one of the data signal amplitude envelope, the phase difference, the data signal distortion, the data signal frequency composition, a data stream resulting from detecting the data signal, and phase difference between the data clock and a normalized data clock, the normalized data clock based on relative phase amongst data clocks from a plurality of data signals.

A dropout resistant phase-locked loop is also provided. The PLL includes a phase detector for outputting a phase difference signal indicating phase difference between the data signal and the data clock when a disable signal is not asserted and indicating zero phase difference between the data signal and the data clock when the disable signal is asserted. A loop error controller inputs the phase difference signal and outputs a filtered phase difference signal. A voltage controlled oscillator inputs the filtered phase difference signal and outputs the read clock. A comparison system generates the disable signal based on at least one data signal quality indication and at least one threshold level. The comparison system asserts the disable signal when at least one data signal quality indication falls outside of at least one threshold level and deasserts the disable signal otherwise.

In an embodiment of the present invention, the loop error controller includes a charge pump for sourcing and sinking charge based on the phase difference signal. A filter/compensator outputs the filtered phase difference signal based on charge sourced and sinked by the charge pump.

In another embodiment of the present invention, the loop error controller includes a differential charge pump outputting a switched charge source and a switched charge sink based on the phase difference signal. A differential filter/compensator outputs the filtered phase difference signal based on the switched charged source and switched charged sink. The differential filter/compensator also outputs a common mode signal indicating voltage levels within the differential filter/ compensator. A high voltage correcting charge pump and a low voltage correcting charge pump lower and raise common mode voltage respectively in the differential filter/compensator based on voltage correction signals. A common mode correction circuit generates voltage correction signals based on the common mode signal when the disable signal is not asserted and disables correcting charge pumps when the disable signal is asserted.

A system for reading data recorded on magnetic tape is also provided. The system includes a read head for generating a read signal based on field transitions written on the magnetic tape as the magnetic tape moves by the read head. Conditioning electronics amplify and equalize the read signal. A comparison system asserts a disable signal when read signal quality falls outside of at least one threshold level and deasserts the disable signal otherwise. A data detector generates a data stream from the condition read signal based on a data clock. A phase-locked loop outputs the data clock having frequency and phase based on phase difference between the data pulses and the data clock. The PLL holds the data clock frequency constant and minimizes phase shift during periods when the read signal quality is outside of the at least one threshold level.

A method for generating a dropout resistant data clock is also provided. A data signal is received. A data signal quality indication is determined. A difference signal is set to indicate no phase difference between the data signal and the data clock if the data quality indication falls outside of at least one threshold level. Otherwise, the difference signal is determined to be the phase difference between the data signal and the data clock . The data clock is generated based on the difference signal.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIG. 1 is a block diagram of a magnetic tape recording system that incorporates the present invention;

FIG. 2 is a block diagram of a dropout resistant phase-locked loop having a single-ended loop error controller according to an embodiment of the present invention;

BEST MODE FOR CARRYING OUT THE INVENTION

Figure 3:
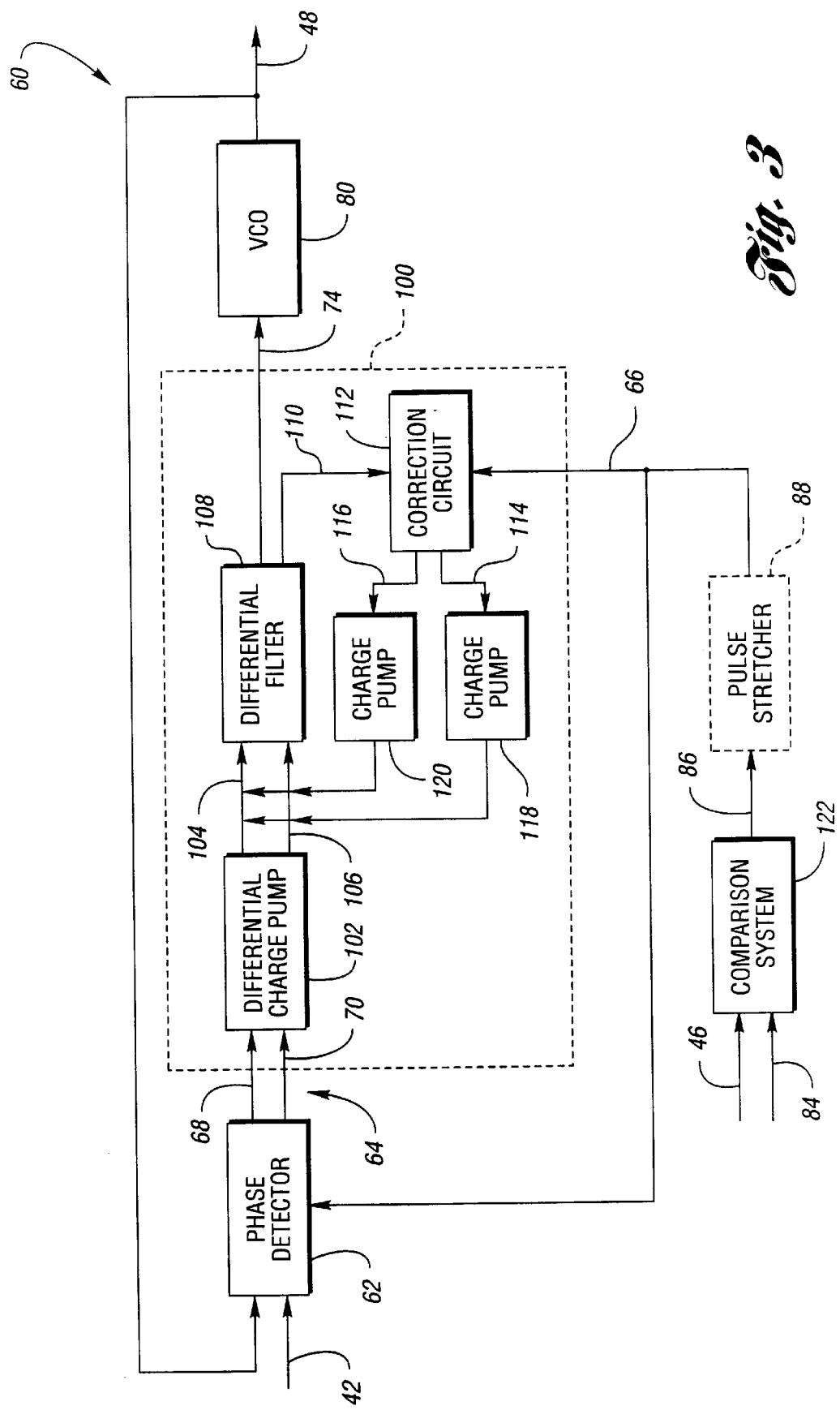
FIG. 3 is a block diagram of a dropout resistant phase-locked loop having a differential loop error controller according to an embodiment of the present invention.

Referring now to FIG. 1, a block diagram of a magnetic tape reading system that incorporates the present invention is shown. A magnetic tape system, shown generally by 20, reads digital information recorded on magnetic tape 22. As magnetic tape 22 moves by read head 24, field transitions, one of which is indicated by 26, produce changing flux 28 which is converted by read head 24 into read signal 30. Automatic gain control (AGC) 32 corrects for drops in the average level of read signal 30 to produce gain compensated read signal 34. Equalizer 36 corrects the frequency response of gain compensated read signal 34 to compensate for linear distortion introduced by elements such as read head 24. Conditioning electronics such as AGC 32 and equalizer 36 amplify and equalize read signal 30 to produce conditioned read signal 38. Data detector 40 generates data signal 42 having analog pulses representing digital information stored on magnetic tape 22 based on conditioned read signal 38. Clock generator 44 uses data signal 42 and at least one data signal quality indication 46 to generate data clock 48. Clock generator 44 includes a phase-locked loop (PLL) generating the frequency and phase of data clock 48 based on the phase difference between data signal 42 and data clock 48. Clock generator 44 varies the frequency and phase of data clock 48 to compensate for variations in the speed of tape 22 past read head 24, stretching of tape 22, variations in the operating conditions of read system 20, and the like. The frequency of data clock 48 is held constant during periods when read signal quality, as provided by one or more data signal quality indications 46, falls outside of one or more threshold levels. Data detector 40 generates data stream 50 by sampling data signal 42 using data clock 48.

Data signal quality indications 46 may be one or more of a variety of factors. The data signal amplitude envelope may be obtained by passing conditioned read signal 38 through an envelope detector. If the envelope amplitude drops below a threshold level, dropout may be occurring. The phase difference between data signal 42 and data clock 48 may also be used. If the phase difference exceeds a threshold level, dropout may be occurring. Another indication of signal quality is the amount of distortion in data signal 42. If the amount of distortion exceeds a threshold, dropout may be occurring. Data signal 42 may also be examined for frequency composition. If the relative amount of high frequency components in data signal 42 drops below a threshold, dropout may be occurring. Further, data stream 50 may be examined to determine the quality of data signal 42. Information written on magnetic tape 22 is often encoded to prohibit certain data patterns from occurring. For example, long strings of zeros may not be permitted. If such an illegal bit pattern appears in data stream 50, dropout may be occurring. Yet another indication of signal quality may be obtained in multichannel tape systems. Each tape channel generates data clock 48. A comparison of the phase of each data clock 48 to a normalized phase for all data clocks 48 is made. A shift in phase of any one data clock 48 or a small subset of data clocks 48 relative to the normalized phase may indicate dropout. As will be recognized by one of ordinary skill in the art, many techniques are possible for determining data signal quality. Any or all of the these indicators may be weighted and combined to form data signal quality indication 46. Data quality indicators are further described with regard to FIGS. 2–7 below.

Referring now to FIG. 2, a block diagram of a dropout resistant phase-locked loop having a single-ended loop error controller according to an embodiment of the present invention is shown. A PLL, shown generally by 60, includes phase detector 62. Phase detector 62 generates a phase difference signal, shown generally by 64, indicating phase difference between data signal 42 and data clock 48 when disable signal 66 is not asserted. Phase detector 62 generates phase difference signal 64 indicating zero phase difference between data signal 42 and data clock 48 when disable signal 66 is asserted.

Phase difference signal 64 indicates one of three states. The first state indicates that the phase of data signal 42 leads data clock 48. The second state indicates that the phase of data signal 42 lags data clock 48. The third state indicates that data signal 42 and data clock 48 are in phase. The three states of phase difference signal 64 may be implemented by up signal 68 and down signal 70. Up signal 68 is asserted for an amount of time proportional to the amount of time data signal 42 leads data clock 48. Down signal 70 is asserted for an amount of time proportional to the amount of time data signal 42 lags data clock 48. A circuit that may be used to implement phase detector 62 is described with regards to FIG. 8 below.

Loop error controller 72 inputs phase difference signal 64 and outputs filtered phase difference signal 74. Loop error controller 72 sets the dynamic performance of PLL 60. Loop error controller 72 is a single-ended filter including charge pump 76 and a filter/compensator, shown generally by 78. Charge pump 76 sources charge, as indicated by current $I_{SOURCE}$, based on up signal 68. Likewise, charge pump 76 sinks charge, as indicated by current $I_{SINK}$, based on down signal 70.

In the embodiment shown, filter/compensator 78 includes capacitor $C_F$ in series with the parallel combination of capacitor $C_C$ and resistor $R_C$ connected between the output of charge pump 76 and ground. Sourced charge $I_{SOURCE}$ charges filter/compensator 78 and sinked charge $I_{SINK}$ discharges filter/compensator 78. While a second-order filter/compensator 78 is shown, many other filter configurations and orders may be used as is known in the art of PLLs.

Voltage controlled oscillator (VCO) 80 accepts filtered phase difference signal 74 and generates data clock 48. The construction and operation of circuits that may be used to implement VCO 80 are well known in the electronic arts.

Comparator 82 accepts data quality signal indication 46 and threshold level 84. Comparator 82 asserts comparison output 86 when data signal quality indication 46 is beneath threshold level 84 and deasserts comparison output 86 otherwise. In one embodiment of the present invention, comparison output 86 is disable signal 66.

In another embodiment of the present invention, pulse stretcher 88 generates disable signal 66 based on comparison output 86. Pulse stretcher 88 delays the transition of disable signal 66 from deasserted to asserted by a preset delay time. Pulse stretcher 88 provides a time qualifier which increases the immunity of PLL 60 to dropout on data signal 42. A circuit implementing comparator 82 and pulse stretcher 88 is described with regard to FIG. 9 below.

In the embodiment shown in FIG. 2, envelope detector 90 produces the amplitude envelope of data signal 42 as data signal quality indication 46 based on conditioned read signal 38. The construction and operation of circuits that may be used to implement envelope detector 90 are well known in the electronic arts.

Referring now to FIG. 3, a block diagram of a dropout resistant phase-locked loop having a differential loop error controller according to an embodiment of the present invention is shown. Single-ended loop error controller 72 has been replaced with differential loop error controller 100 in PLL 60. Differential loop error controller 100 includes differential charge pump 102. Differential charge pump 102 outputs switched charge source 104 based on up signal 68 and switched charge sink 106 based on down signal 70. Differential filter 108 is charged by switched charge source 104 and discharged by switched charge sink 106 to produce filtered phase difference signal 74. Differential filter 108 also outputs common mode signal 110 indicating common mode voltages within differential filter/compensator 108.

Common mode correction circuit 112 generates high voltage correction signal 114 and low voltage correction signal 116 based on common mode signal 110 to keep the operating voltage of differential filter 108 within preset limits if disable signal 66 is not asserted. If common mode signal 110 is above a high voltage level and disable signal 66 is not asserted, common mode correction circuit 112 asserts high voltage correction signal 114. High voltage correcting charge pump 118 then sinks current on both switched charge source 104 and switched charge sink 106, thereby reducing the common mode operating voltage of differential filter 108. Likewise, if common mode signal 110 is below a preset low voltage level and disable signal 66 is not asserted, common mode correction circuit 112 asserts low voltage correction signal 116. Low voltage correcting charge pump 120 then sources charge to both switched charge source 104 and switched charge sink 106, raising the common mode operating voltage of differential filter 108. If disable circuit 66 is asserted, no correcting of common mode filtering voltages occurs. A circuit implementing differential loop error controller 100 is described with regard to FIG. 10 below.

PLL 60 shown in FIG. 3 includes comparison system 122 for determining comparison output 86 based on one or more data signal quality indications 46 and one or more threshold levels 84. For example, comparison system 122 may implement a function such as described in Equation 1:

| ASSERT disable | IF | signal_distortion > thresh1 AND phase_difference > thresh2 | (1) |
| | OR IF | data_stream = pattern1 | | where disable is disable signal 66, signal distortion is a measure of the distortion in data signal 42, thresh1 is threshold level 84 for distortion in data signal 42, phase_difference is the difference in phase between data signal 42 and data clock 48, thresh2 is threshold level 84 for the phase difference, data_stream is the most recent consecutive bit stream of data stream 50, and pattern1 is a bit stream pattern such as a string of consecutive zeros. Comparison system 122 may be implemented using analog electronics, digital logic, software executing on a processor, or any combination of these forms.

Figure 4:
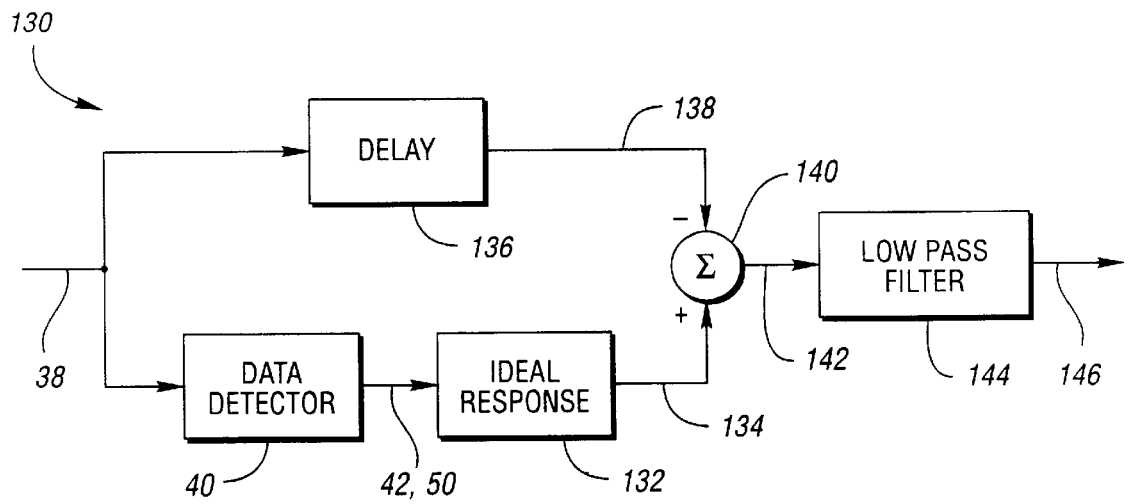
FIG. 4 is a block diagram of a system for determining data signal distortion according to an embodiment of the present invention.

Referring now to FIG. 4, a block diagram of a system for determining data signal distortion according to an embodiment of the present invention is shown. A distortion estimator, shown generally by 130, generates an estimate of the distortion of data signal 42 using conditional read signal 38 upon which data signal quality indication 46 can be based. Conditioned read signal 38 is split into two paths. Data detector 40 accepts one path of conditioned read signal 38 and produces data signal 42 and data stream 50. Ideal response generator 132 can be constructed to receive either data signal 42 or data stream 50 and output ideal read signal 134 representing a dropout free conditioned read signal 38. Delay 136 delays the other path of conditioned read signal 38 to compensate for processing delays in data detector 40 and ideal response 132. Delayed read signal 138 is subtracted from ideal read signal 134 by summer 140. The resulting instantaneous distortion level 142 is averaged by low pass filter 144 to produce read signal distortion level 146 which may be used as data signal quality indication 46.

Figure 5:
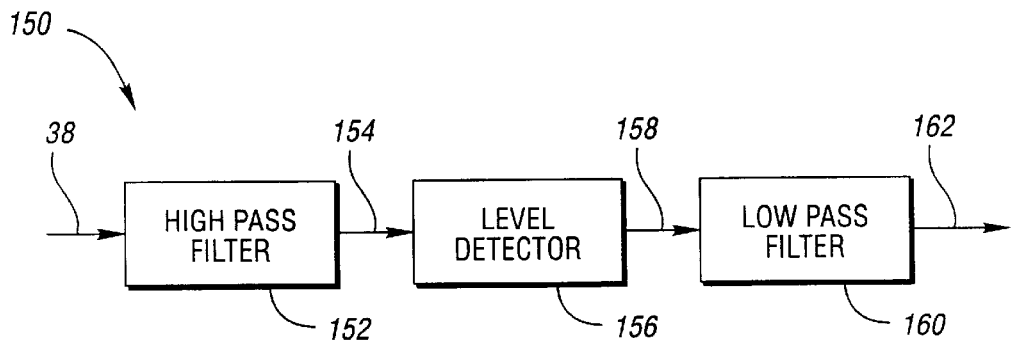
FIG. 5 is a block diagram of a system for determining high frequency composition of the data signal according to an embodiment of the present invention.

Referring now to FIG. 5, a block diagram of a system for determining high frequency composition of the data signal according to an embodiment of the present invention is shown. A high frequency composition estimator, shown generally by 150, generates a signal indicating the frequency composition of data signal 42 upon which data signal quality indication 46 may be based. In addition to decreasing the amplitude envelope of read signal 30, dropout attenuates high frequency components of read signal 30. This decrease may be detected by passing conditioned read signal 38 through high pass filter 152. The cutoff frequency for high pass filter 152 should preferably be above the frequency of data clock 48. The resulting high pass filtered read signal 154 is processed by level detector 156 to produce high frequency composition signal 158. Level detector 156 may be, for example, an envelope detector. Low pass filter 160 generates data signal high frequency level 162 representing a running average high frequency composition signal 158.

Figure 6:
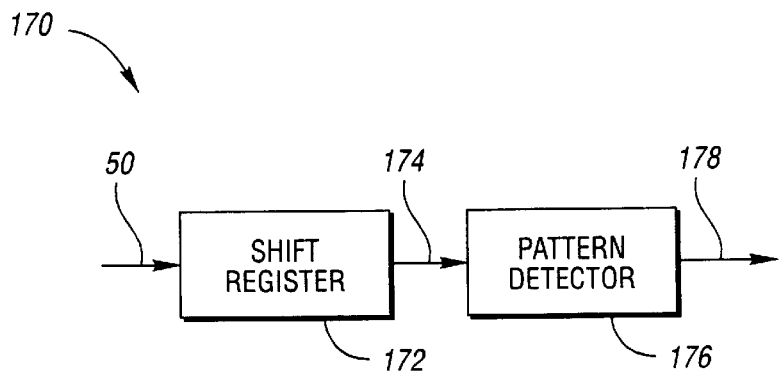
FIG. 6 is a block diagram of a system for determining data signal quality from the data stream according to an embodiment of the present invention.

Referring now to FIG. 6, a block diagram of a system for determining data signal quality from the data stream according to an embodiment of the present invention is shown. A data stream examiner, shown generally by 170, uses data stream 50 resulting from detecting data signal 42 to produce an error signal which may be used as data signal quality indication 46. Shift register 172 accepts serial data stream 50 and outputs parallel data pattern 174 representing the most recent set of data bits received. Pattern detector 176 examines data pattern 174 for bit combinations that should not occur if data stream 50 is free of errors. If pattern detector 176 detects a sequence in data pattern 174 that should not exist, data pattern error signal 178 is asserted. In data stream examiner 170, bit stream patterns function as threshold levels 84 and data signal quality indication 46 falls outside of threshold level 84 if a bit pattern in data stream 50 matches threshold level 84.

Figure 7:
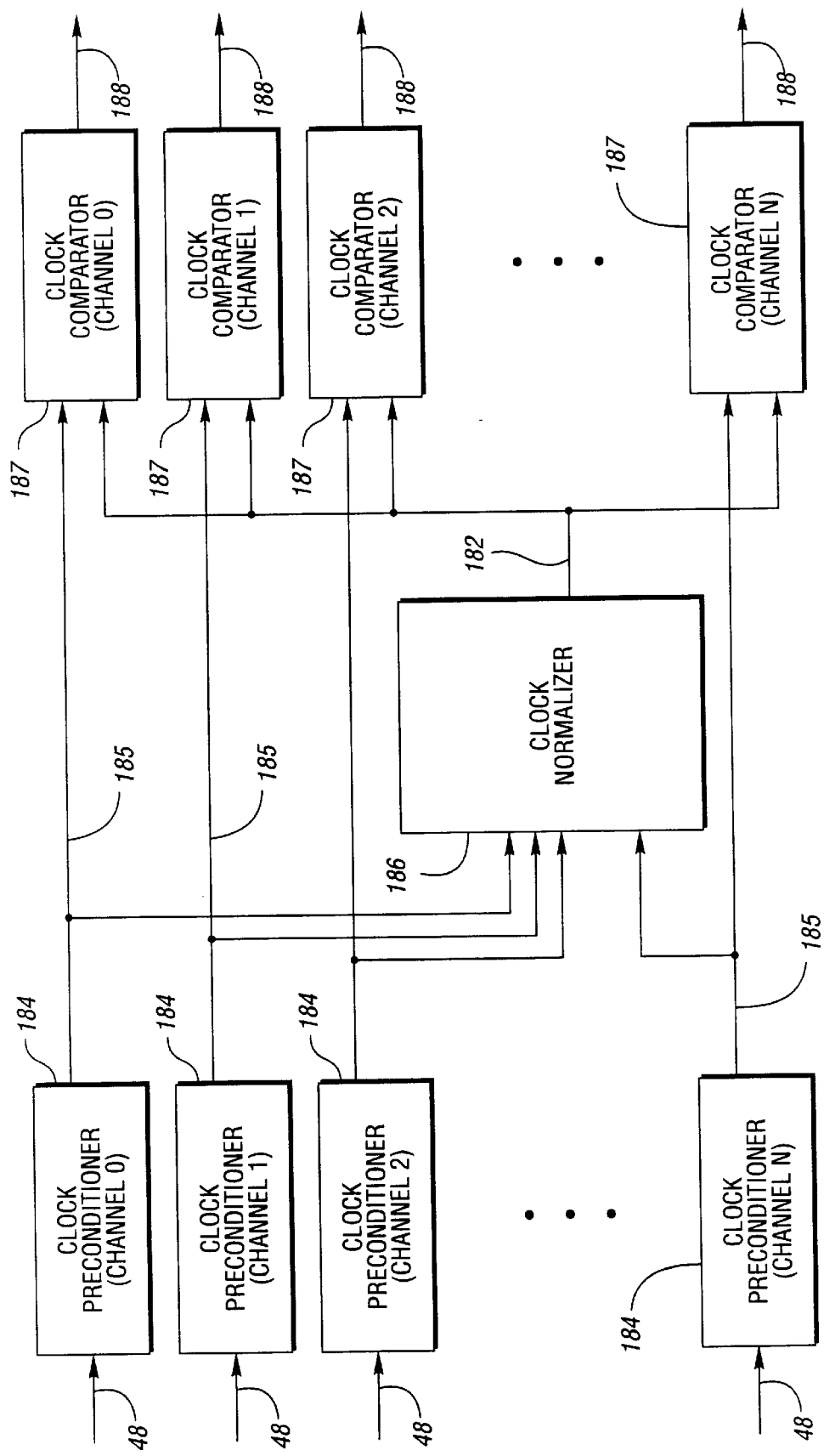
FIG. 7 is a block diagram of a system for determining data clock drift by comparing the data clock to other data clocks in a multichannel tape system.

Referring now to FIG. 7, a block diagram of a system for determining data clock drift by comparing the data clock to other data clocks in a multichannel tape system is shown. A multichannel clock comparator, shown generally by 180, determines phase difference between each data clock 48 and normalized data clock 182 based on relative phase amongst data clocks 48 from a plurality of data signals 42. For each channel, data clock 48 is input into clock preconditioner 184 which compensates for global shifts in data clocks 48 due to effects such as skew of magnetic tape 22 relative to head 24. Techniques for measuring skew are well known in the art of magnetic tape systems. Each clock preconditioner 184 generates compensated data clock 185 correcting data clock 48 for any global clock shift. All compensated data clocks 185 are used by clock normalizer 186 to generate normalized data clock 182. Clock normalizer 186 generates normalized data clock 182 representing a time average of compensated data clocks 185. Each channel includes clock comparator 187 accepting normalized data clock 182 and compensated data clock 185 from corresponding clock preconditioner 184. Clock comparator 187 generates clock difference signal 188 indicating the phase difference between compensated data clock 185 and normalized data clock 182. For each channel, clock difference signal 188 may be used as one data signal quality indication 46.

Figure 8:
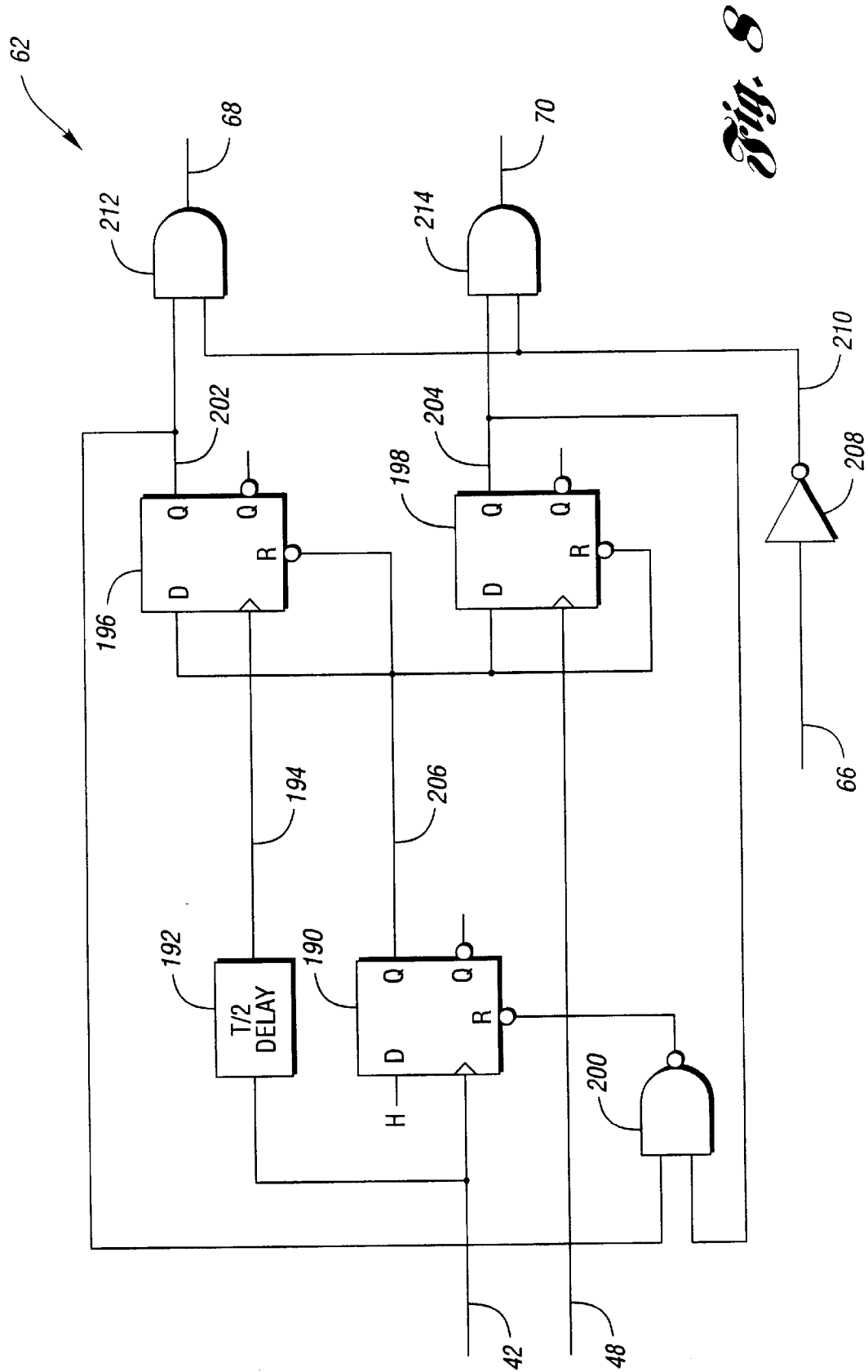
FIG. 8 is a circuit diagram of a phase detector according to an embodiment of the present invention.

Referring now to FIG. 8, a circuit diagram of a phase detector according to an embodiment of the present invention is shown. Phase detector 62 measures the phase difference between data signal 42 and data clock 48. If disable signal 66 is not asserted, phase detector 62 asserts up signal 68 or down signal 70 for a period of time proportional to the phase difference. If disable signal 66 is asserted, up signal 68 and down signal 70 remain unasserted.

Positively edge triggered D flip flop 190 is clocked by data signal 42. The D input for flip flop 190 is tied high so that the state of flip flop 190 is set to one on the rising edge of data signal 42. Delay 192 delays data signal 42 for an amount of time equal to one-half of the period of data clock 48 to produce delayed data signal 194. Positively edge triggered D flip flop 196 is clocked by delayed data signal 194. Positively edge triggered D flip flop 198 is clocked by data clock 48. The low asserting asynchronous reset of flip flop 190 is connected to NAND gate 200. NAND gate 200 logically ANDs high asserting flip flop state 202 for flip flop 196 and high asserting flip flop state 204 for flip flop 198. The D and reset inputs for flip flop 196 and flip flop 198 are connected to high asserting flip flop state 206 of flip flop 190. Inverter 208 accepts disable signal 66 and produces not disable signal 210. AND gate 212 generates up signal 68 from inputs high asserting flip flop state 202 and non disable signal 210. AND gate 214 generates down signal 70 from inputs high asserting flip flop state 204 and not disable signal 210.

During operation, phase detector 62 receives a rising edge on data signal 42, setting the state of flip flop 190. This causes high asserting flip flop state 206 to become asserted, releasing the resets for flip flops 196, 198. If data signal 42 is in phase with data clock 48, the rising edge on data signal 42, propagated by delay 192 and appearing as a rising edge on delayed data signal 194, strikes the clock input of flip flop 196 at the same time that the rising edge for data clock 48 strikes the clock input of flip flop 198. Both flip flops 196, 198 will be set to one asserting both high asserting flip flop states 202, 204. This causes the output of NAND gate 200 to go low, resetting flip flop 190, and resetting flip flops 196, 198. For a brief period of time, depending on gate delays in phase detector 62, both high asserting flip flop states 202, 204 are asserted.

If the rising edge on delayed data signal 194 leads the rising edge on data clock 48, high asserting flip flop state 202 becomes asserted before high asserting flip flop state 204 by an amount of time equal to the amount of time the rising edge on delay data signal 194 precedes the rising edge on data clock 48. Conversely, if the rising edge on data clock 48 leads the rising edge on delay data signal 194, high asserting flip flop state 204 becomes asserted before high asserting flip flop state 202 by an amount of time equal to the amount of time the rising edge on data clock 48 precedes the rising edge on delay data signal 194. Hence, the difference in the asserted times between high asserting flip flop state 202 and high asserting flip flop state 204 indicates the phase difference between data signal 42 and data clock 48. If disable signal 66 is not asserted, high asserting flip flop state 202 is passed by AND gate 212 as up signal 68 and high asserting flip flop state 204 is passed by AND gate 214 as down signal 70. If disable signal 66 is asserted, up signal 68 and down signal 70 remain unasserted.

Figure 9:
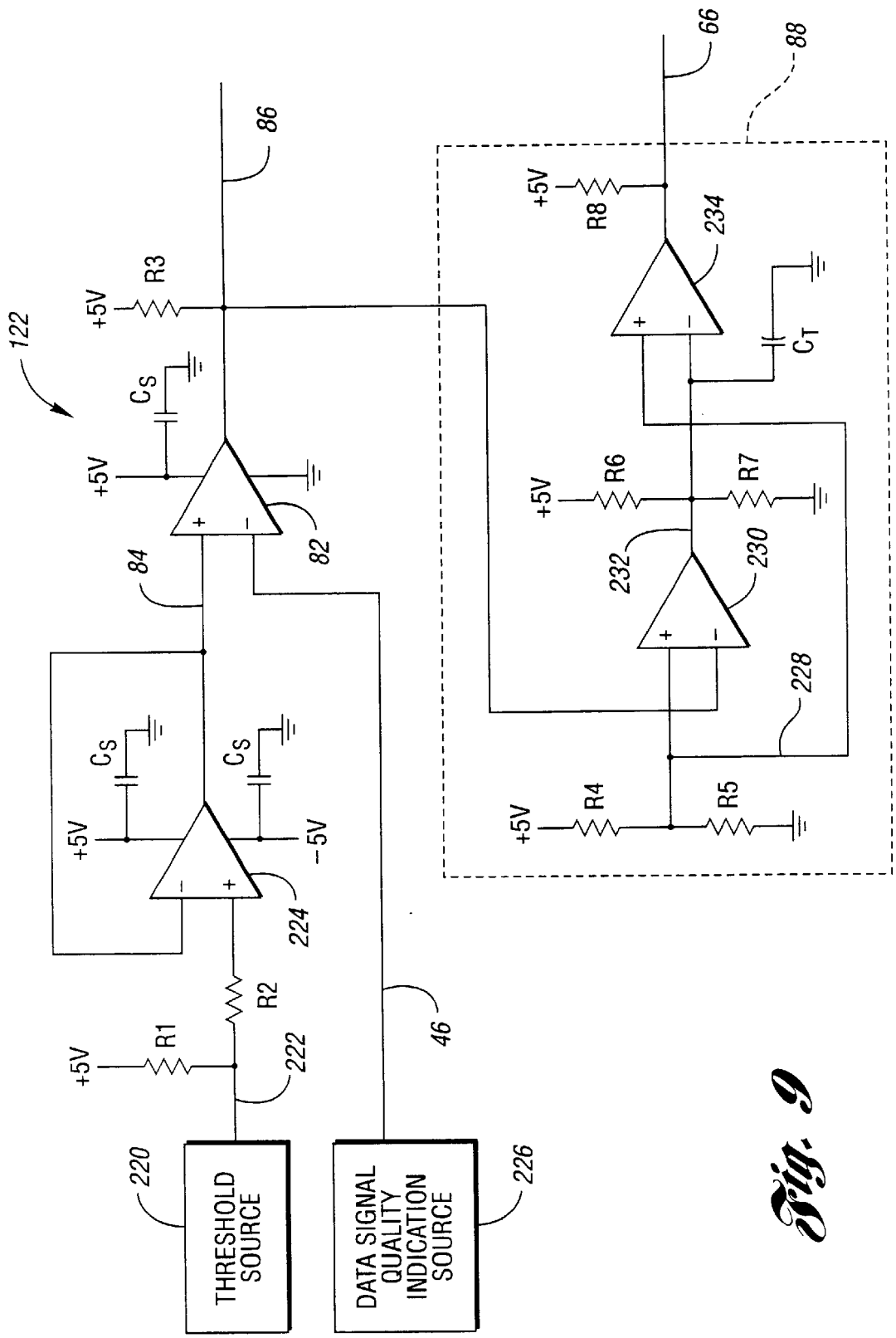
FIG. 9 is a circuit diagram of a comparison system and a pulse stretcher according to an embodiment of the present invention.

Referring now to FIG. 9, a circuit diagram of a comparison system and a pulse stretcher according to an embodiment of the present invention is shown. Comparison output 86 is asserted when the level of data signal quality indication 46 drops below threshold level 84 and becomes deasserted when data signal quality indication 46 rises above threshold level 84. In one embodiment of the present invention, disable signal 66 is comparison output 86. In another embodiment of the present invention, pulse stretcher 88 inputs comparison output 86 and generates disable signal 66 having a delayed transition from asserted to unasserted on comparison output 86. This delayed transition of disable signal 66 going from asserted to unasserted decreases the probability that PLL 60 will lose lock.

Threshold source 220 may be a fixed voltage or may be a variable source. For example, threshold source 220 may develop threshold voltage 222 as the output of a digital-to-analog converter under the control of a microprocessor. Resistor R1 provides pull-up for threshold voltage 222. Resistor R2, connected between threshold voltage 222 and the input of voltage follower 224, limits current supplied by threshold source 220. Typical values for R1 and R2 are 1.6 kΩ and 10 kΩ, respectively. The output of voltage follower 224 is threshold level 84. Data signal quality indication source 226 generates data signal quality indication 46 based on at least one of a variety of factors including data signal amplitude envelope, the phase difference between data signal 42 and data clock 48, distortion in data signal 42, the frequency composition of data signal 42, the composition of data stream 50, the phase of data clock 48 relative to a normalized data clock based on many data clocks 48, and the like. Data signal quality indication 46 is described with regards to FIGS. 1–7 above. Comparator 82 accepts threshold level 84 and data signal quality indication 46 and generates comparison output 86. Resistor R3, typically 1.3 kΩ, provides pull-up for comparison output 86. Source capacitors $C_s$ reduce noise on the supply inputs of voltage follower 224 and comparator 82.

Within pulse stretcher 88, resistors R4 and R5 form a voltage divider setting reference voltage 228. Typically, R4 and R5 have the same value such as 1 kΩ. Comparison output 86 and reference voltage 228 serve as inputs to comparator 230. The output of comparator 230, timing voltage 232, is connected by resistor R6 to positive supply voltage and is connected by resistor R7 in parallel with capacitor $C_T$ to ground. Comparator 234 inputs timing voltage 232 and reference voltage 228 and produces disable signal 66 pulled high by resistor R8, typically 1.3 kΩ. During operation, when comparison output 86 rises above reference voltage 228, comparator 230 attempts to drive timing voltage 232 low. The decrease in timing voltage 232 is governed primarily by capacitor $C_T$ discharging through the low output resistance of comparator 230 when comparator 230 is outputting a low voltage. When timing voltage 232 drops below reference voltage 228, comparator 234 asserts disable signal 66. Similarly, when comparison output 86 drops below reference voltage 228, comparator 230 attempts to drive timing voltage 232 high. Rising timing voltage 232 is determined by the rate at which capacitor $C_T$ charges through resistor R6. When timing voltage 232 exceeds reference voltage 228, comparator 234 deasserts disable signal 66. Typically, resistor R6 is quite large compared to the output resistance of comparator 230 when comparator 230 is outputting a low voltage. Thus, the delay between when comparison output 86 goes high and when disable signal 66 goes high is relatively short while the delay between when comparison output 86 goes low and when disable signal 66 goes low is relatively long. For a 5 volt power supply, typical values for R6, R7, and $C_T$ are 1.3 kΩ, 11.8 kΩ, and 11.4 nF, respectively. This provides an approximately 10 μs delay between comparison output 86 becoming deasserted and the corresponding deassertion of disable signal 66.

Figure 10:
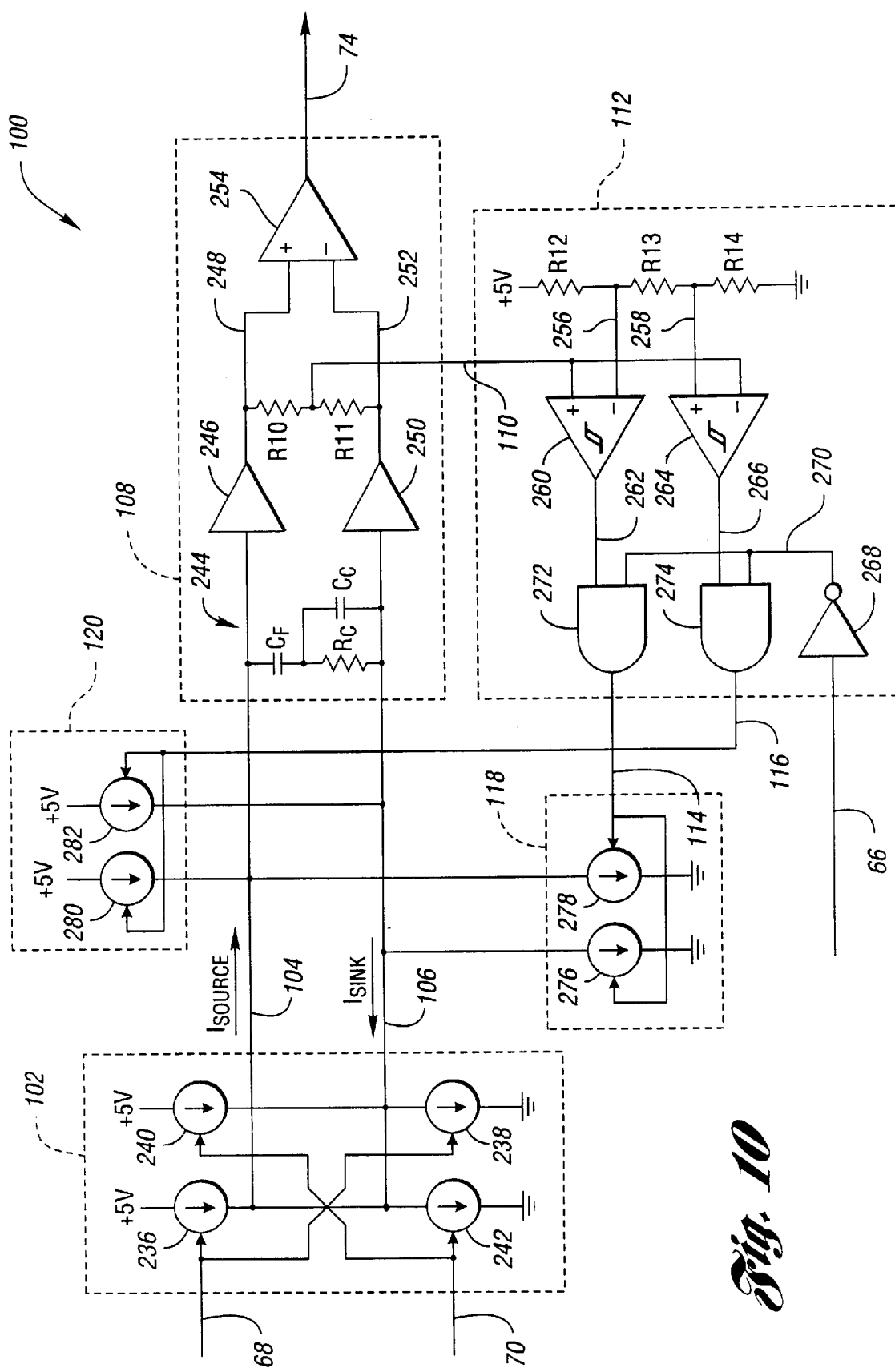
FIG. 10 is a circuit diagram of a differential loop error controller according to an embodiment of the present invention.

Referring now to FIG. 10, a circuit diagram of a differential loop error controller according to an embodiment of the present invention is shown. Differential charge pump 102 includes switched current source 236 sourcing current to switched charge source 104 and switched current sink 238 sinking current to switched charge sink 106, both sources 236,238 controlled by up signal 68. When up signal 68 is asserted, sources 236,238 cause the differential voltage within differential filter/compensator 108 to increase. Differential charge pump 102 also includes switched current source 240 sourcing current to switched charge sink 106 and switched current sink 242 sinking current to switched charge source 104, both sources 240,242 controlled by down signal 70. When down signal 70 is asserted, sources 240,242 cause the differential voltage within differential filter/compensator 108 to decrease.

Differential filter/compensator 108 includes filter components, shown generally by 244, connected between switched charge source 104 and switched charge sink 106, for setting the dynamic characteristics of PLL 60. As described with regard to filter/compensator 78 in FIG. 2 above, various combinations and configurations for filter components 244 are known in the art of PLLs. High input impedance buffer 246 buffers switched charge source 104 to produce buffered charge source signal 248. High input impedance buffer 250 buffers switched charge sink 106 to produce buffered charge sink signal 252. Differential amplifier 254 outputs filtered phase difference signal 74 as the difference between buffered charge source signal 248 and buffered charge sink signal 252. Resistors R10 and R11, connected in series between buffered charge source signal 248 and buffered charge sink signal 252, are center-tapped to produce common mode signal 110. Resistors R10 and R11 typically have the same value.

Common mode correction circuit 112 includes resistors R12, R13, and R14 connected in series between positive power supply and ground. The connection between R12 and R13 is tapped to produce high voltage reference 256. The connection between R13 and R14 is tapped to produce low voltage reference 258 less than high voltage reference 256. Schmitt trigger comparator 260 generates comparator output 262 based on inputs common mode signal 110 and high voltage reference 256. Comparator 260 asserts comparator output 262 when common mode signal 110 exceeds high voltage reference 256. Schmitt trigger comparator 264 generates comparator output 266 based on inputs common mode signal 110 and low voltage reference 258. Comparator 264 asserts comparator output 266 when common mode signal 110 drops below low voltage reference 258. Inverter 168 inputs disable signal 66 and outputs inverted disable signal 270. AND gate 272 outputs high voltage correction signal 114 based on inputs comparator output 262 and inverted disable signal 270. AND gate 272 outputs comparator output 262 as high voltage correction signal 114 when disable signal 66 is not asserted and deasserts high voltage correction signal 114 when disable signal 66 is asserted. AND gate 274 outputs low voltage correction signal 116 based on inputs comparator output 266 and inverted disable signal 270. AND gate 274 outputs comparator output 266 as low voltage correction signal 116 when disable signal 66 is not asserted and deasserts low voltage correction signal 116 when disable signal 66 is asserted.

High voltage correcting charge pump 118 includes switched current sink 276 connected between switched charge sink 106 and ground and switched current sink 278 connected between switched charge source 104 and ground. Switched current sinks 276,278 are controlled by high voltage correction signal 114. Switched current sinks 276, 278 are matched to sink the same amount of current when high voltage correction signal 114 is asserted, thereby lowering the common mode voltage of differential filter/compensator 108 without affecting filtered phase difference signal 74. Low voltage correcting charge pump 120 includes switched current source 280 connected between positive power supply and switched charge source 104 and switched current source 282 connected between positive power supply and switched charge sink 106. Switched current sources 280,282 are controlled by low voltage correction signal 116. Switched current sources 280,282 are matched to source the same amount of current when low voltage correction signal 116 is asserted, thereby raising the common mode voltage of differential filter/compensator 108 without affecting filtered phase difference signal 74.

Figure 11:
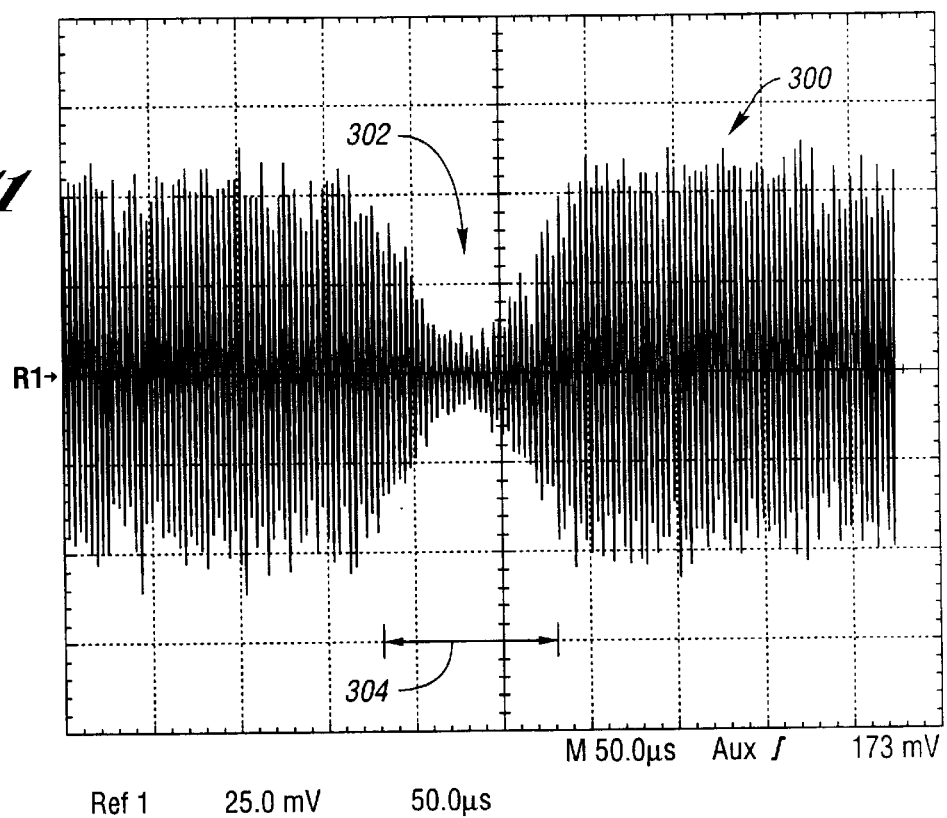
FIG. 11 is a drawing illustrating a 100 µs data signal dropout.

Referring now to FIGS. 11–15, oscilloscope tracings illustrating dropout and operation of the present invention are shown. To produce FIGS. 11–15, actual magnetic tape dropouts were captured on a digital oscilloscope. An arbitrary waveform generator was used to feed the captured signal into PLL 60 including differential loop error controller 100 as described with regard to FIGS. 3 and 10 above as well as phase detector 62 as described with regard to FIG. 8 above. Data signal quality indication 46 was based on the output of envelope detector 90 as described with regard to FIGS. 2 and 9 above. Referring now to FIG. 11, a drawing illustrating a 100 µs data signal dropout is shown. A portion of conditioned read signal 38, shown generally by 300, includes a dropout, shown generally by 302, extending over dropout duration 304 of approximately 100 µs. Most notable during dropout 302 is a sharp decrease in the amplitude envelope of signal 300. In dropouts resulting from defects in magnetic tape 22, pulses occurring during dropout 302 suffer high frequency loss that tends to smear data pulses together. This linear distortion may also be accompanied by non-linear distortion.

Figure 12:
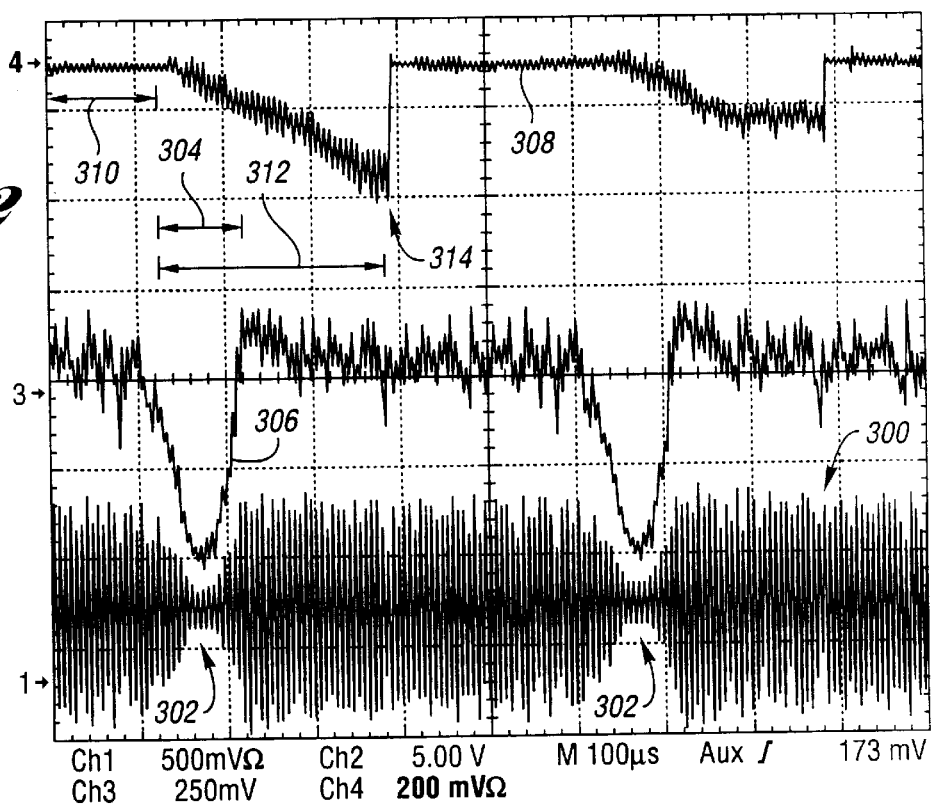
FIG. 12 is a drawing illustrating loss of phase-locked loop lock due to a 100 µs dropout.

Referring now to FIG. 12, a drawing illustrating loss of phase-locked loop lock due to a 100 µs dropout is shown. Signal 300 is shown with two dropouts 302, each having dropout duration 304 of approximately 100 µs. Amplitude envelope signal 306 illustrates the severe loss of signal 300 occurring during dropout 302. Curve 308 shows a portion of filtered phase difference signal 74. During period 310 prior to dropout 302, curve 308 exhibits small perturbations about a fixed voltage indicating PLL 60 is locked. During dropout 302, curve 308 steadily declines and the perturbations increase indicating PLL 60 has lost lock. The duration of lost lock, indicated by period 312, extends well beyond dropout duration 304. PLL 60 does not regain lock until time 314 when a resynchronizing character is read from tape 22.

Figure 13:
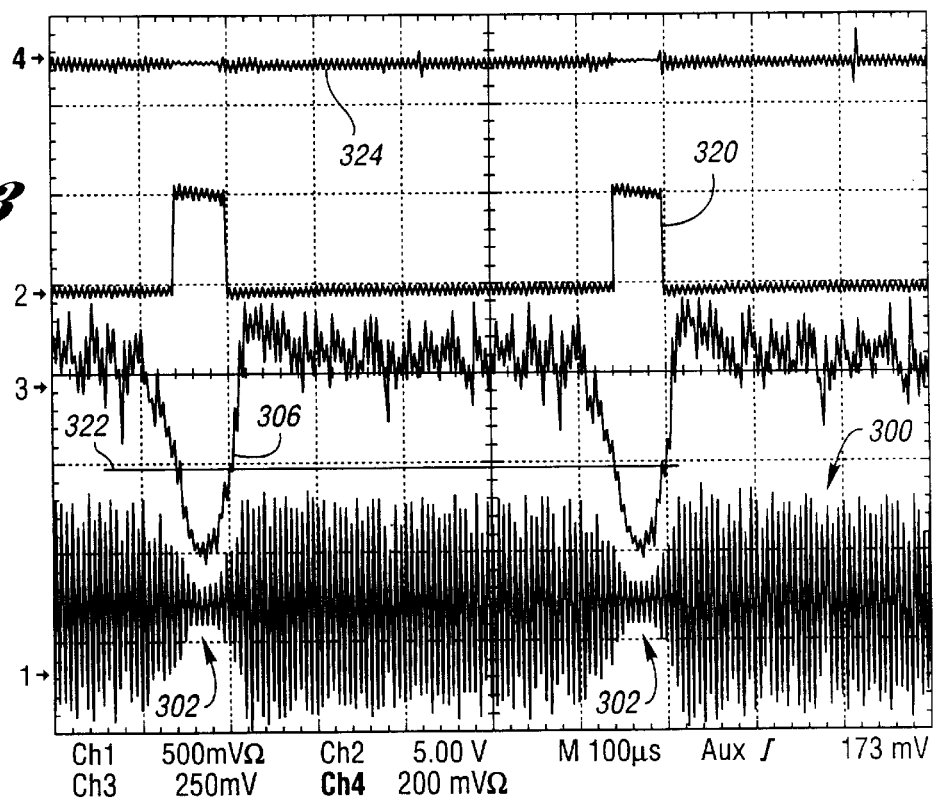
FIG. 13 is a drawing illustrating operation of an embodiment of the present invention during a 100 µs dropout.

Referring now to FIG. 13, a drawing illustrating operation of an embodiment of the present invention during a 100 µs dropout is shown. PLL 60 generates disable signal 66, a portion of which is indicated by 320. Disable signal 320 is asserted when amplitude envelope signal 306 drops beneath threshold level 84 approximated by level 322. Curve 324 represents filtered phase difference signal 74 for PLL 60 in which phase difference signal 64 is zero when disable signal 320 is asserted. When dropout 302 ends, PLL 60 is able to reestablish lock because the phase of data clock 48 has not drifted substantially from the phase of data signal 42.

Figure 14:
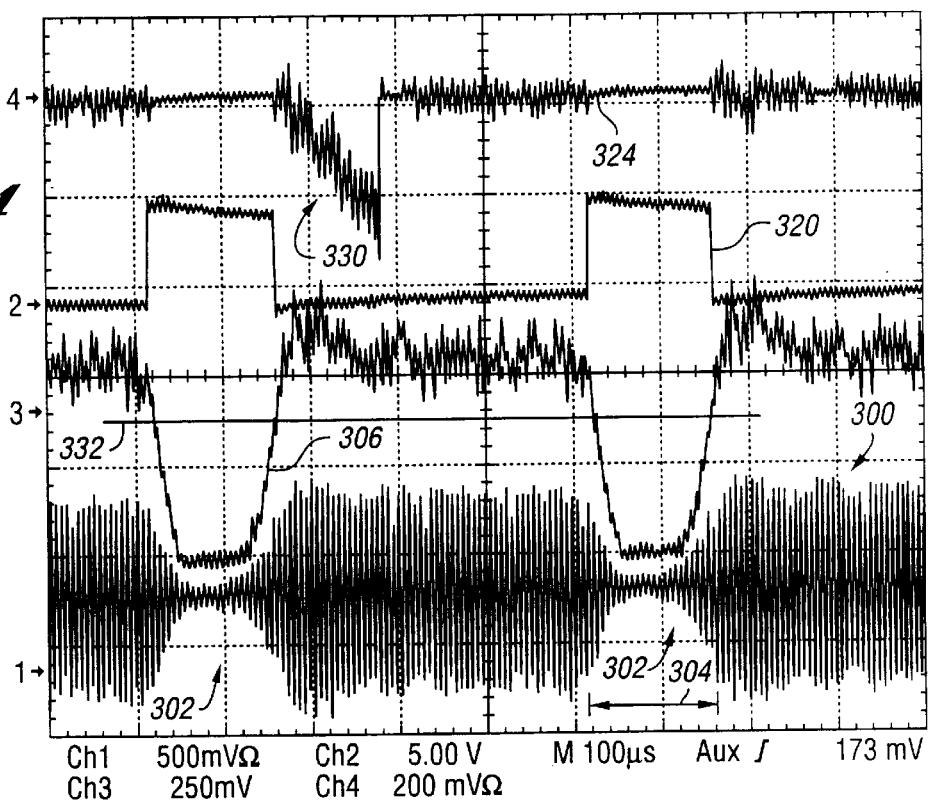
FIG. 14 is a drawing illustrating operation of an embodiment of the present invention during a 150 µs dropout.

Referring now to FIG. 14, a drawing illustrating operation of an embodiment of the present invention during a 150 µs dropout is shown. Signal 300 is shown with two dropouts 302, each having a dropout duration 304 of approximately 150 µs. As dropout duration 304 increases, there is an increase in the probability that a drift in phase between data signal 42 and data clock 48 will be great enough to cause PLL 60 to lose lock when disable signal 320 is deasserted. This can be seen by a drift, shown generally by 330, in curve 324. Increasing threshold level 84, shown by 332, decreases the probability of lost lock by permitting signal 300 to recover to a higher level before deasserting disable signal 320. However, increasing threshold level 332 beyond a certain point causes disable signal 320 to become asserted during times outside of dropout period 304. Threshold level 332 in FIG. 14 is set near the point where false assertions of disable signal 320 will occur.

Figure 15:
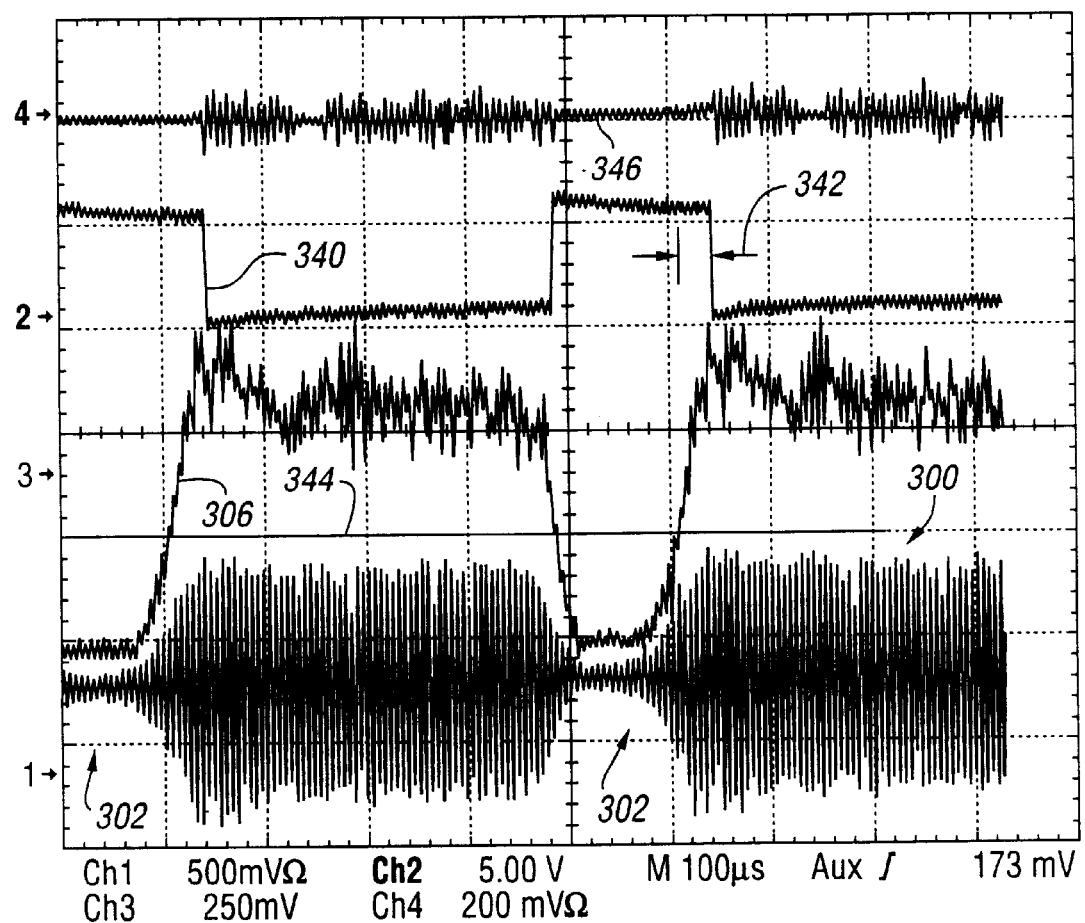
FIG. 15 is a drawing illustrating operation of an embodiment of the present invention including pulse stretching during a 150 µs dropout.

Referring now to FIG. 15, a drawing illustrating operation of an embodiment of the present invention including pulse stretching during a 150 µs dropout is shown. Pulse stretcher 88 permits a lower threshold level 84 to be used and still allow sufficient time for signal 300 to recover from dropout 302. The deassertion of pulse stretched disable signal 340 is delayed by time 342 to permit signal 300 to recover from dropout 302. This permits threshold level 84, indicated by level 344, to be low enough not to cause false assertions of disable signal 340, while still allowing sufficient time for signal 300 to recover from dropout 302. Filtered phase difference signal 74 from PLL 60 including pulse stretcher 88 is shown by curve 346. Curve 346 indicates no loss of lock for the same input signal 300 and threshold level 332 causing drift 330 shown in FIG. 14.

While embodiments of the invention have been illustrated and described, it is not intended that these embodiments illustrate and describe all possible forms of the invention. Rather, the words used in the specification are words of description rather than limitation, and various changes may be made without departing from the spirit and scope of the invention. For example, many circuits are possible for implementing phase detector 62, comparison system 122, pulse stretcher 88, loop error controller 72, and differential loop error controller 100. These systems may be implemented with analog electronics, digital logic, software executing on a processor, or any combination of these or other techniques.

What is claimed is:

1. A dropout resistant phase-locked loop for synchronizing a received data signal with a read clock comprising:

a phase detector in communication with the received data signal and the read clock, the phase detector operative to output a phase difference signal indicating phase difference between the received data signal and the read clock when a disable signal is not asserted and indicating zero phase difference between the data signal and the read clock when the disable signal is asserted;

a loop error controller operative to input the phase difference signal and output a filtered phase difference signal, the loop error controller operative to set phase-locked loop dynamic performance;

a voltage controlled oscillator operative to input the filtered phase difference signal and output the read clock; and a comparison system for generating the disable signal based on at least one data signal quality indication, the comparison system operative to assert the disable signal when the at least one data signal quality indication falls outside of at least one threshold level and deassert the disable signal otherwise;

whereby the effect of data signal dropout is reduced by having the voltage controlled oscillator generate constant frequency and minimize phase shift during periods when the at least one data signal quality indication falls outside of the at least one threshold level.

2. A dropout resistant phase-locked loop as in claim 1 wherein the at least one data signal quality indication is based on at least one from a set including a data signal amplitude envelope, the phase difference between the received data signal and the read clock, data signal distortion, a data signal frequency composition, a data stream resulting from detecting the received data signal, and a phase difference between the read clock and a normalized read clock, wherein the normalized read clock is based on relative phases amongst read clocks from a plurality of data signals.

3. A dropout resistant phase-locked loop as in claim 1 wherein the loop error controller comprises:

a charge pump in communication with the phase detector, the charge pump operative to source charge and to sink charge based on the phase difference signal; and a filter/compensator in communication with the charge pump, the filter/compensator operative to output the filtered phase difference signal based on charge sourced and sinked by the charge pump.

4. A dropout resistant phase-locked loop as in claim 1 wherein the loop error controller comprises:

a differential charge pump in communication with the phase detector, the differential charge pump operative to output a switched charge source and a switched charge sink based on the phase difference signal;

a differential filter/compensator in communication with the differential charge pump, the differential filter/compensator operative to output the filtered phase difference signal based on the switched charge source and the switched charge sink, the differential filter/compensator further operative to output a common mode signal indicating voltage levels within the differential filter/compensator;

a high voltage correcting charge pump operative to lower common-mode voltage in the differential filter/compensator based on a high voltage correction signal;

a low voltage correcting charge pump operative to raise common-mode voltage in the differential filter/compensator based on a low voltage correction signal; and a common-mode correction circuit in communication with the differential filter/compensator, the high voltage correcting charge pump, the low voltage correcting charge pump, and the comparison system, the common-mode correction circuit operative to generate the high voltage correction signal and the low voltage correction signal based on the common mode signal when the disable signal is not asserted, the high voltage correction signal and the low voltage correction signal causing the voltage correcting charge pumps to keep voltage levels within the differential filter/compensator within preset limits, the common-mode correction circuit further operative to generate the high voltage correction signal and the low voltage correction signal to disable the voltage correcting charge pumps when the disable signal is asserted.

5. A dropout resistant phase-locked loop as in claim 1 further comprising a pulse stretcher following the comparison system, the pulse stretcher operative to delay the transition of the disable signal from asserted to deasserted by a preset delay time.

6. A system for reading data recorded on magnetic tape comprising:

a read head operative to generate a read signal based on field transitions written on the magnetic tape as the magnetic tape moves by the read head;

conditioning electronics in communication with the read head operative to amplify and equalize the read signal;

a comparison system operative to assert a disable signal when read signal quality falls outside of at least one threshold level and to deassert the disable signal otherwise;

a data detector in communication with the conditioning electronics operative to generate a data stream from the conditioned read signal based on a data clock; and a phase-locked loop in communication with the comparison system and the data detector operative to output the data clock having frequency and phase based on a phase difference between the data stream and the data clock, the phase-locked loop further operative to hold constant the data clock frequency and minimize phase shift during periods when the read signal quality falls outside of the at least one threshold level.

7. A dropout resistant system as in claim 6 wherein the phase-locked loop is further operative to resume output of the data clock frequency and phase based on phase difference between the data stream and the data clock a preset delay time after the read signal quality has returned within the at least one threshold level.

8. A dropout resistant system as in claim 6 wherein the read signal quality is based on at least one from a set including the data stream amplitude envelope, the phase difference, the data stream distortion, the data stream frequency composition, the data stream, and a phase difference between the data clock and a normalized data clock, wherein the normalized data clock is based on relative phases amongst data clocks from a plurality of data signals read from the magnetic tape.

9. A dropout resistant system as in claim 6 further comprising an envelope detector in communication with the data stream operative to produce a data signal amplitude envelope as the read signal quality.

10. A method for generating a dropout resistant data clock comprising:

receiving a data signal;

determining at least one data signal quality indication;

setting a difference signal to indicate no phase difference between the data signal and the data clock if at least one determined data signal quality indication falls outside of at least one threshold level, otherwise determining the difference signal as the phase difference between the data signal and the data clock; and generating the data clock based on the difference signal.

11. A method for producing a dropout resistant data clock as in claim 10 wherein setting the difference signal further comprises continuing to set the difference signal to indicate no phase difference between the data signal and the data clock for a delay period after the data signal quality indication rises above the threshold level.

12. A method for producing a dropout resistant data clock as in claim 10 wherein determining the at least one data signal quality indication comprises at least one of a set including:

- determining a data signal amplitude envelope,
- determining data signal distortion,
- determining data high frequency composition,
- determining the number of consecutive zeros resulting from data signal detection, and determining a phase difference between the data clock and a normalized data clock, wherein the normalized data clock is based on relative phases amongst data clocks from a plurality of data signals.

13. A method for producing a dropout resistant data clock as in claim 10 further comprising:

filtering the difference signal; and correcting common mode filtering voltages if the at least one data signal quality indication does not fall outside of the at least one threshold level.

* * * * *